(12) United States Patent
Goldschmidt et al.

(10) Patent No.: US 8,507,790 B2
(45) Date of Patent: Aug. 13, 2013

(54) SOLAR ELEMENT WITH INCREASED EFFICIENCY AND METHOD FOR INCREASING EFFICIENCY

(75) Inventors: Jan Christoph Goldschmidt, Frelburg (DE); Philipp Loeper, Freiburg (DE); Marius Peters, Freiburg (DE)

(73) Assignees: Fraunhofer-Gesellschaft zur Foerderung der Angewandten Forschung E.V., Munich (DE); Albert-Ludwigs-Universitaet Freiburg, Freiburg (DE)

( * ) Notice: Subject to any disclaimer, the term of this patent is extended or adjusted under 35 U.S.C. 154(b) by 458 days.

(21) Appl. No.: 12/733,851

(22) PCT Filed: Jul. 15, 2008

(86) PCT No.: PCT/EP2008/005779
§ 371 (c)(1),
(2), (4) Date: Jun. 8, 2010

(87) PCT Pub. No.: WO2009/039906
PCT Pub. Date: Apr. 2, 2009

(65) Prior Publication Data
US 2010/0307584 A1 Dec. 9, 2010

(30) Foreign Application Priority Data
Sep. 24, 2007 (DE) .......................... 10 2007 045 546

(51) Int. Cl.
*H01L 31/00* (2006.01)
(52) U.S. Cl.
USPC ........... 136/257; 136/259; 359/359; 359/584; 359/589; 359/590

(58) Field of Classification Search
USPC ................. 136/243–265; 359/548, 589, 590, 359/359, 360
See application file for complete search history.

(56) References Cited

U.S. PATENT DOCUMENTS

| 4,110,123 | A | * | 8/1978 | Goetzberger et al. | ......... 136/247 |
| 4,144,097 | A | * | 3/1979 | Chambers et al. | ............ 136/247 |
| 4,155,371 | A | * | 5/1979 | Wohlmut et al. | ............. 136/247 |
| 4,367,367 | A | * | 1/1983 | Reisfeld et al. | ................ 136/247 |
| 6,274,860 | B1 | * | 8/2001 | Rosenberg | ................. 250/203.4 |

(Continued)

FOREIGN PATENT DOCUMENTS

| GB | 1 562 994 | 3/1980 |
| WO | WO 03/079457 A1 | 9/2003 |
| WO | WO 2006/088369 A2 | 8/2006 |

OTHER PUBLICATIONS

Goldschmidt, J.C., et al. "Advanced Upconverter Systems with Spectral and Geometric Concentration for high Upconversion Efficiencies." Conference on Optoelectronic and Microelectronic Materials and Devices. Proceedings 2008, Presented Jul. 28, 2008-Aug. 1, 2008.*

(Continued)

*Primary Examiner* — Alicia Toscano
*Assistant Examiner* — Liesl C Baumann
(74) *Attorney, Agent, or Firm* — Marshall & Melhorn, LLC

(57) ABSTRACT

A solar element with increased efficiency and also a method for increasing the efficiency of a solar cell are provided. The solar cell comprises a luminescent element, an upconverter, and also at least one selectively reflecting structure.

14 Claims, 2 Drawing Sheets

(56) References Cited

U.S. PATENT DOCUMENTS

| | | | |
|---|---|---|---|
| 2002/0074035 A1* | 6/2002 | Gravisse et al. | 136/257 |
| 2004/0123895 A1* | 7/2004 | Kardauskas et al. | 136/244 |
| 2007/0138391 A1* | 6/2007 | Garber et al. | 250/330 |
| 2009/0027872 A1 | 1/2009 | Debije et al. | |
| 2009/0044861 A1 | 2/2009 | Debije et al. | |
| 2009/0056791 A1* | 3/2009 | Pfenninger et al. | 136/247 |
| 2009/0120488 A1* | 5/2009 | Gorog et al. | 136/247 |

OTHER PUBLICATIONS

Goetzberger, A., et al. "Solar Energy Conversion with Fluorescent Concentrators." Applied Physics 14, 123-139 (1977).*

Rau, U., et al. "Efficiency Limits of Photovoltaic Fluorescent Collectors." Applied Physics Letters, 87, 171101 (2005).*

A. Shalav et al.; "Application of NaYF4:Er3+ up-converting phosphors for enhanced near-infrared silicon solar cell response"; Applied Physics Letters, 2005, vol. 86, No. 1, American Institute of Physics, pp. 13505-1-13505-3; XP002543132.

T. Trupke et al; "Improving solar cell efficiencies by up-conversion of sub-ban-gap light"; Journal of Applied Physics, Oct. 1, 2002; vol. 92, No. 7; pp. 4117-4122; XP012057396.

C. Struempel et al; "Erbium-Doped Up-Converters on Silicon Solar Cells: Assessment of the Potential"; Proceedings of the 20th European Photovoltaic Solar Energy Conference; 2005; pp. 43-46; XP002543131.

C. Struempel et al; "Modifying the solar spectrum to enhance silicon solar cell effeciency—An overview of available materials"; Solar Energy Materials and Solar Cells, Elsevier Science Publishers, Amsterdam, NL; Dec. 10, 2006; vol. 91, No. 4; pp. 238-249; XP005882124.

C. Struempel et al; "Enhancing Silicon Solar Cell Effeciency by Modifying the Solar Spectrum"; Photovoltaic Energy Conversion, Conference Record of the 2006 IEEE 4th World Conference ON, IEEE, PI; Jan. 1, 2006; pp. 87-90; XP0341007244.

* cited by examiner

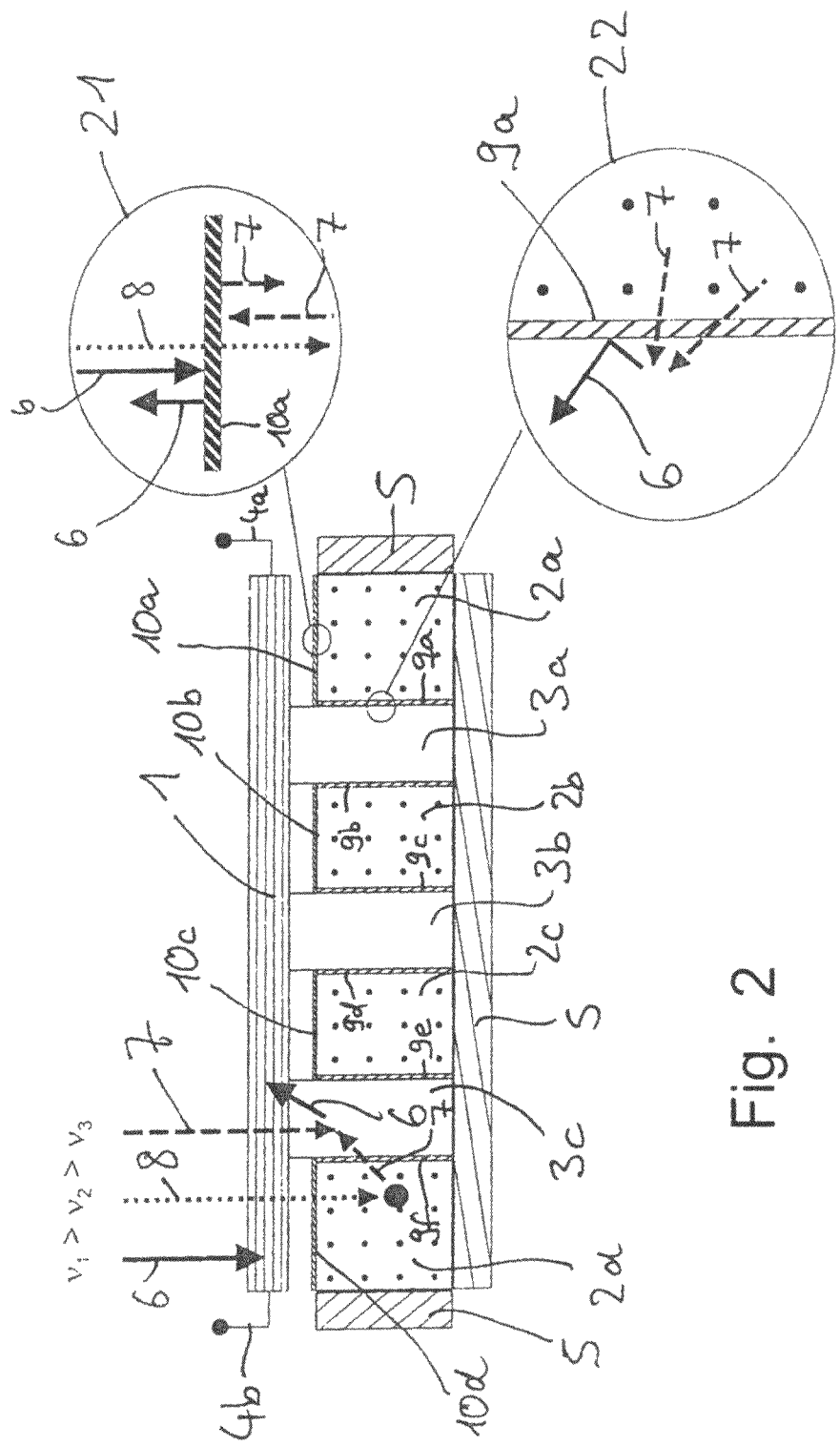

SOLAR ELEMENT WITH INCREASED EFFICIENCY AND METHOD FOR INCREASING EFFICIENCY

BACKGROUND OF THE INVENTION

The present invention relates to a solar element with increased efficiency and also to a method for increasing the efficiency of a solar cell.

More than 20% of the energy contained in the solar spectrum is lost during conversion of the incident radiation by means of silicon solar cells as a result of so-called sub-band gap losses. There are herewith described losses which are produced because the energy of a single photon does not suffice to produce a freely moveable electron. They occur when the energy of a photon falls below the so-called band gap energy. Losses of this type occur in all types of solar cells. Their level is dependent upon the band gap energy of the solar cell material which is used. The described losses can be reduced in that a plurality of photons with too low energy are converted with so-called upconverting materials into one photon with sufficient energy.

The following problems hereby occur: firstly the absorption range of upconverters is very narrow. Upconversion is possible at all only for the few photons in this spectral range.

In order to make more photons usable for the upconversion, a substance with special luminescent properties can be used. This absorbs in the entire or in a part of the spectral range between band gap and absorption range of the upconverter and emits radiation at a wavelength which can be used by the upconverting material for upconversion. However, possible materials with corresponding luminescent properties also absorb in the spectral range in which the upconverters radiate the upconverted light. As a result, only a small part of the upconverted radiation reaches the solar cell. Without further measures, a large part of the upconverted radiation is therefore lost by undesired absorption.

A further problem resides in the fact that the efficiency of the conversion of two low energy photons into a higher energy photon is very low. The upconversion is a non-linear process since more than one photon is involved therein. The upconversion efficiency therefore increases, at least at low intensities, linearly with the flow density of the photons which can be used in principle by the upconverter (A. Shalav, B. S. Richards, T. Trupke et al., Appl. Phys. Lett. 86 (2005) 13505). The problem of very low upconversion efficiencies can therefore be reduced by concentration of the incident sunlight. In T. Trupke, M. A. Green, P. Würfel, Journal of Applied Physics, 92, 71 (2002), the possibility of concentration by means of a lens is mentioned. For experimental investigation of the upconversion effects, generally lasers with high intensity are used (in comparison with the sun spectrum in the corresponding spectral range).

The widening of the spectral range which can be used for the upconversion with fluorescent colourants is described briefly in C. Strümpel, M. McCann, C del Cañizo et al., Proceedings of the 20$^{th}$ EUPVSEC (2005), Barcelona. However no concrete conversions are proposed.

BRIEF SUMMARY OF THE INVENTION

It is firstly the object of the present invention to minimise the loss of the upconverted radiation by absorption. This object is achieved by the solar element and also by the method according to the present invention. Advantageous developments of the solar cell according to the invention and of the method according to the invention are provided.

The idea underlying the invention is to separate the upconverters from the luminescent elements spatially and to dispose, between the upconverters and the luminescent elements, first selectively reflecting and/or selectively transmitting layers or structures. Preferably, these selectively reflecting structures reflect electromagnetic radiation with energies which are higher than the band gap energy of the solar cell. Electromagnetic radiation, the frequency of which is between the smallest frequency which can be converted by the upconverter and the band gap frequency of the solar cell, should preferably be transmitted from the selectively reflecting structure. In this way, radiation with a frequency less than the band gap frequency of the solar cell impinges on the luminescent elements. These then emit radiation with frequencies which can be converted by the upconverter. This radiation passes through the selectively reflecting layer and impinges on the upconverter. The latter converts the incident radiation and emits radiation with frequencies greater than the band gap frequency of the solar cell. Since the selectively reflecting layer reflects radiation with frequencies greater than the band gap energy, the radiation emitted by the upconverter cannot pass back into the luminescent element and is therefore not absorbed there.

According to the invention, the solar element now has at least one solar cell which has a band gap frequency $v_{BG}$. Furthermore, the solar element according to the invention has at least one luminescent element which absorbs electromagnetic radiation with frequencies between two frequencies $v_{LE1}$ and $v_{LE2}$ and emits electromagnetic radiation with at least a frequency $v_{LE3}$. The luminescent elements are preferably disposed such that radiation coming from a light source, such as for example the sun, which is not absorbed in the solar cell because of its low energy, radiates through the latter onto the luminescent elements. Solar cells and luminescent elements are therefore disposed in succession respectively in the direction of the beam path of incident radiation.

The solar element according to the invention has in addition at least one upconverter which absorbs electromagnetic radiation with frequencies between two frequencies $v_{HK1}$ and $v_{HK2}$ and emits radiation with at least a frequency $v_{HK3}$. This upconverter is disposed such that light which is emitted by the luminescent element impinges on the upconverter.

According to the invention, there is now disposed between the luminescent elements and the upconverters at least one first selectively reflecting layer which reflects a part of the incident electromagnetic radiation and transmits a part of this radiation.

The luminescent elements are now chosen such that the smallest frequency $v_{LE1}$ absorbed by them is smaller than the band gap energy of the solar cell $v_{BG}$. The radiation $v_{LE3}$ emitted by the luminescent elements is according to the invention in the frequency range which can be absorbed by the upconverter, i.e. between $v_{HK1}$ and $v_{HK2}$. The upconverter then emits radiation with a frequency $v_{HK3}$ which is greater than or equal to the band gap frequency of the solar cell $v_{BG}$.

If light from a light source therefore impinges on the solar cell, then the proportion of the light which has a frequency greater than the band gap frequency of the solar cell is absorbed by the solar cell, whilst that radiation with lower frequencies passes through the solar cell. This radiation passing through the solar cell now impinges on the luminescent elements which absorb a part of this radiation. The luminescent elements then radiate light and/or radiation with at least a specific frequency or in at least one preferably narrow, frequency range. This emitted radiation is normally emitted non-directionally. At least a part of this radiation now impinges on upconverters which convert the radiation into radiation with a higher frequency. Since the first selectively reflecting layers are disposed between the luminescent elements and the upconverters, the radiation to be upconverted can pass from the luminescent element into the upconverter, on the one hand, on the other hand however, the upconverted radiation cannot radiate into the luminescent element. The unconverted radiation is therefore radiated in the direction of the solar cell and then impinges at least partially on the solar cell.

It is therefore essential to the invention that the luminescent elements and the upconverters respectively are disposed adjacently separated by a first selectively reflecting structure. In addition, the upconverters are disposed adjacent to the solar cells so that the upconverted radiation can impinge on the solar cell. Preferably, the luminescent elements are likewise disposed adjacent to the solar cell in order that that radiation not absorbed by the solar cell can pass through the latter onto the luminescent elements.

It is preferred if the luminescent elements, wherever they are disposed not adjacent to the solar cell, the first reflecting layer, the upconverter or other elements, are surrounded by mirrors. These mirrors can cover partially or completely the corresponding surfaces of the luminescent elements. The lateral surfaces of the luminescent elements are preferably flat so that the mirrors which are likewise flat are disposed parallel to these lateral faces. It is achieved by these mirrors that the radiation of a suitable frequency is absorbed completely by the luminescent element and radiation emitted by the luminescent element passes completely into the upconverters.

As already described, it is advantageous if the first reflecting structure reflects electromagnetic radiation with frequencies which are greater than the band gap frequency of the solar cell $v_{BG}$ and transmits electromagnetic radiation with frequencies between the smallest upconvertible radiation $v_{HK1}$ and the band gap frequency $v_{BG}$. At least the first selectively reflecting structure should transmit electromagnetic radiation with frequencies between $v_{HK1}$ and $v_{HK2}$. Advantageously, as large a proportion of the light as possible with frequencies greater than $v_{BG}$ should be reflected from the first selectively reflecting structure.

It is hereby particularly advantageous if the first selectively reflecting structures transmit electromagnetic radiation with frequencies which are between $v_{HK2}$ and $v_{BG}$.

Basically it is not necessary for the mentioned components of the solar element to abut directly against each other, i.e. in a form fit. However, in particular for simple production and a small constructional size, it is advantageous if at least some or all of the mentioned elements abut directly against each other, i.e. touch each other. Thus the at least one luminescent element can be disposed abutting directly against a first selectively reflecting structure and/or at least one first selectively reflecting structure can be disposed directly abutting against at least one upconverter and/or at least one upconverter can be disposed directly abutting against a solar cell. Between the solar cell and the luminescent elements, an air gap can be present, light- or radiation-permeable materials can be disposed or the solar cell and the luminescent elements can be disposed touching each other.

As already portrayed, the efficiency of the upconverters increases with the intensity of the radiated radiation. It is therefore advantageous for the present invention if the radiation can be concentrated onto the upconverter. According, to the invention, this can be achieved in that the sum of that part of the surface area of the upconverters which is orientated towards the solar cell plus the parts of the surface are of the luminescent elements which are orientated towards the solar cell but not covered by an upconverter is greater than the sum of the surface areas between luminescent elements and upconverters. It is particularly advantageous if the luminescent elements are surrounded by reflecting layers or structures. Preferably, at least one second selectively reflecting structure is disposed hereby on the sides of the luminescent element directly adjacent to the solar cell, which second selectively reflecting structure reflects a part of the radiation impinging thereon and transmits a part of the radiation impinging thereon. This second selectively reflecting structure is therefore disposed between the luminescent elements and the solar cell. On those sides of the luminescent elements which are orientated neither towards the solar cell nor towards an upconverting element, preferably mirrors are disposed, which reflect at least that light which has frequencies between the smallest frequency which can be absorbed by the luminescent element and/or the frequency emitted by the luminescent elements, according to which is smaller, and the band gap frequency of the solar cell.

Preferably, the second selectively reflecting structure reflects electromagnetic radiation with at least a frequency $v_{LE3}$ which is emitted by the corresponding luminescent element. Electromagnetic radiation with frequencies between $v_{LE1}$ and $v_{LE2}$ is transmitted. Alternatively, also electromagnetic radiation with frequencies between $v_{LE1}$ and $v_{BG}$ can be transmitted and reflected above $v_{BG}$, however that radiation with at least a frequency $v_{LE3}$ which is emitted by the luminescent element is reflected.

It is now particularly preferred if the first reflecting layers completely cover the respective boundary regions between the luminescent elements and the correspondingly adjacent upconverters. This means that, of each luminescent element, that side orientated towards the corresponding upconverter is completely covered by the first selectively reflecting layer. In addition, it is particularly preferred if the second selectively reflecting layer completely covers those regions of the surface of the luminescent elements which are orientated towards the solar cell and directly adjacent to the solar cell. It is hereby of importance that those regions of the luminescent elements are covered by the second selectively reflecting layer, which regions abut directly against the solar cell via this second selectively reflecting layer, via intermediate layers which are completely transparent in the relevant frequency range or via air. Wherever the luminescent elements abut against a first selectively reflecting layer and/or an upconverter, no second selectively reflecting layer is disposed.

The object of concentrating the radiation onto the upconverters can now be achieved in that those regions of the luminescent elements which are orientated towards the incident radiation, i.e. towards the solar cell, have a larger surface area than those regions which are orientated towards the upconverters. In this way, the radiation impinges on a large surface area into the luminescent element and leaves the latter however in the direction of the upconverter only via a small surface area. All other surfaces of the luminescent elements as those orientated towards the upconverters are preferably delimited by mirrors or second selectively reflecting structures. In this way, a concentration of the light emitted by the luminescent element onto the upconverter is assisted.

Preferably, a mirror is disposed on each surface of the luminescent elements on which no selectively reflecting layer is disposed.

The solar element according to the invention can be produced in various ways. One possibility resides in disposing upconverters between a luminescent element and the solar cell. If the upconverter is disposed over the entire surface of the luminescent element, orientated towards the solar cell, between the solar cell and the luminescent element, then in fact no concentration effect is achieved but the problem of absorption of the converted radiation is resolved. The first selectively reflecting layer is hereby disposed between the upconverter and the luminescent element. A second selectively reflecting layer is not provided here.

The upconverters can however also cover only a part of that surface of the luminescent element orientated towards the solar cell. In this case, the first selectively reflecting layer is disposed between the upconverter and the luminescent element, whilst preferably a second selectively reflecting layer is applied wherever the luminescent element is adjacent to the solar cell without an upconverter being disposed therebetween. In this case, the above-described concentration effect is achieved. Basically, a concentration effect can be achieved if the sum of all those surface areas of the upconverters which are orientated towards the solar cell so that light emanating from them impinges on the solar cell plus the surface areas of the luminescent elements which are orientated towards the solar cell but not towards an upconverter is greater than the sum of those surface regions with which the luminescent elements are orientated towards the upconverters, where therefore the luminescent elements are covered by upconverters.

Another possibility for producing the solar element according to the invention resides in disposing one or more upconverters between luminescent elements or surrounded by luminescent elements. In this case, the upconverters abut with respectively one lateral surface against the solar cell, whilst they abut with the preferably vertical lateral surfaces, which are not parallel thereto, via respectively a first selectively reflecting layer against the luminescent elements. The luminescent elements are then preferably provided on the sides orientated towards the solar cell with second reflecting structures and are provided with mirrors on those sides which are orientated neither towards the solar cell nor towards an upconverter.

Again, a concentration can be achieved if those surface areas of the luminescent elements which are orientated towards the incident radiation, i.e. towards the solar cell, are in total greater than the surface areas abutting against the upconverters.

Both for the upconverters and for the luminescent elements, in particular cuboids, cubes, cylinders and similar normal geometric objects are suitable. Cuboid structures with lateral surfaces which are at right angles to each other are particularly suitable.

The upconverter preferably has or comprises sodium yttrium fluoride doped with erbium ($NaYF_4$: $Er^{3+}$).

In addition, inorganic crystals are possible as upconverters (as bulk, micro- or nanocrystalline material) such as e.g. $Al_2O_3$, $NaYF_4$, $Er(PO_3)_3$, $Lu(PO_3)$, $Lu(PO_3)_3$, $Y(PO_3)_3$, $Gd(PO_3)_3$, doped with rare earths, such as e.g. erbium, ytterbium, dysprosium or transition metals, or co-doped, e.g. with erbium and ytterbium or transition metals and rare earths.

There can be used as colourants for the luminescent element cyanine, polymethine, Wurster- and Weitz-type radicals, polymethine violenes, monoquinone anions, tetrathiotetracenes, rare earth-doped crystals or organometallic compounds, transition metal compounds, quantum dots, e.g. made of PbSe, PbS (also in so-called core-shell configurations).

These are embedded in PMMA, polycarbonate, other highly transparent polymers, glass or glass ceramics.

The invention is intended to be explained subsequently with reference to some examples.

BRIEF DESCRIPTION OF THE DRAWINGS

There are shown
FIG. 1 a first embodiment of the solar element according to the invention and
FIG. 2 a second embodiment of the solar element according to the invention.

DETAILED DESCRIPTION OF THE INVENTION

Figure 1:
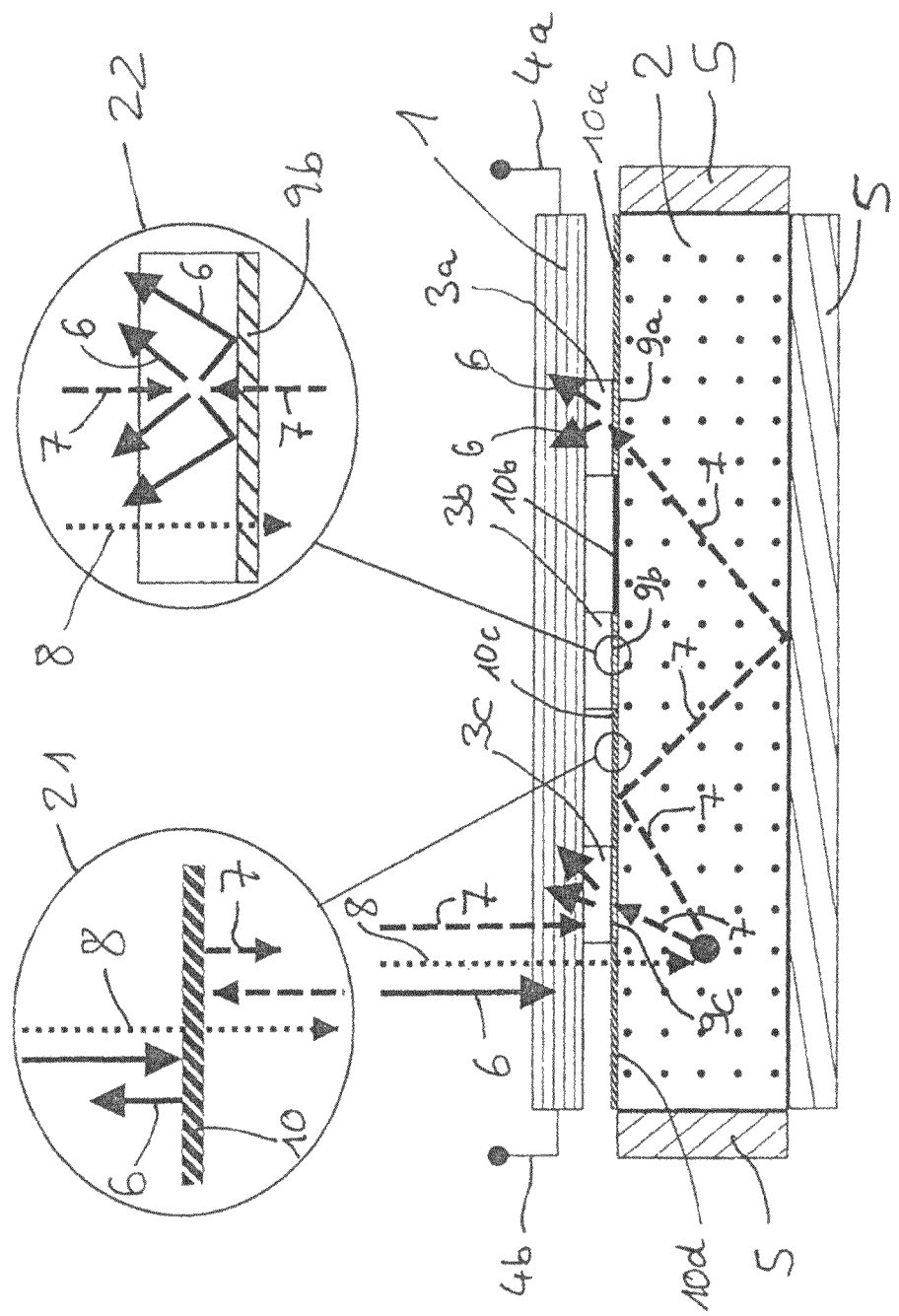

FIG. 1 shows a possible embodiment of the present invention. A cuboid luminescent element 2 is hereby provided on five sides with mirrors 5. A solar cell is disposed next to the sixth side of the luminescent element 2 which is not provided with mirrors 5 with a plane parallel to this side. Between the solar cell 1 and the side of the luminescent material 2 not provided with mirrors, upconverters 3a, 3b and 3c are disposed. These upconverters touch the solar cell 1 directly. Between the luminescent element 2 and the upconverters 3a, 3b and 3c, respectively one first selectively reflecting layer 9a, 9b and 9c is disposed.

Section 22 shows the permeability of the first selectively reflecting layer 9b. Radiation 6, the frequency of which is above the band gap frequency $v_{BG}$ of the solar cell 1, is reflected from the selectively reflecting layer 9b. Radiation 8, which is absorbed by the luminescent material, i.e. has a frequency between $v_{LE1}$ and $v_{LE2}$, is transmitted from the selectively reflecting structure 9b. Likewise, radiation 7, the frequency of which is in a range which can be converted by the upconverter, i.e. which is between $v_{HK1}$ and $v_{HK2}$, likewise is transmitted.

In regions in which the side of the luminescent element 2 which is not provided with a mirror 5 does not abut against an upconverter 3a, 3b or 3c, the surface of the luminescent element 2 is provided with second selectively reflecting structures 10a, 10b, 10c and 10d. These structures 10a to 10d are applied in a form fit on the luminescent material 2. Enlargement 21 shows how radiation is transmitted and/or reflected from this second selectively reflecting structure. Radiation 6 which has a frequency greater than the band gap frequency $v_{BG}$ of the solar cell 1 is reflected from the selectively reflecting layer 10a to 10d.

Radiation 7 is likewise reflected which has a frequency which can be converted by the upconverter 3a, 3b or 3c. In contrast, radiation 8, the frequency of which is between $v_{LE1}$ and $v_{BG}$, i.e. which can be absorbed by the luminescent material but cannot be converted by the upconverter, is transmitted from the selectively reflecting layer 10a to 10d.

The solar cell is electrically connected via terminals 4a and 4b.

If now radiation 6 which can be used by the solar cell impinges on the solar cell 1, then this is absorbed. Radiation 8, the frequency of which is below the band gap frequency $v_{BG}$ of the solar cell 1 is transmitted from the solar cell 1 and impinges on the luminescent material 2. The luminescent material 2 thereupon emits light 7 with a frequency which can be converted by the upconverter 3a, 3b or 3c. If this radiation 7 impinges on the second selectively reflecting structure, then it is reflected back into the luminescent material 2. If however it impinges on the first selectively reflecting structure 9a, 9b or 9c, then it is transmitted into the upconverter 3a, 3b or 3c. In this upconverter 3a, 3b or 3c, it is then converted into radiation 6 with a frequency greater than $v_{BG}$ which is then radiated into the solar cell 1. The sum of the surface areas of the luminescent element, which are orientated towards the solar cell 1 but are not covered by an upconverter 3a, 3b or 3c, and the surface areas of the upconverters 3a, 3b and 3c which are orientated towards the solar cell is greater than the surface area of the first selectively reflecting structures 9a, 9b and 9c together. As a result, the efficiency of the upconverters is increased.

FIG. 2 shows another embodiment of the present invention. Cuboid luminescent elements 2a, 2b, 2c and 2d and also cuboid upconverters 3a, 3b and 3c are disposed here surrounded by five mirrors 5 which are disposed one upon the other vertically. The upconverters 3a to 3c are hereby situated between the luminescent elements 2a to 2d. The lateral surfaces of the upconverters 3a to 3c and of the luminescent elements 2a to 2d are parallel to each other and parallel to the mirrors 5 which are perpendicular to the solar cell. Respectively one upconverter 3a, 3b or 3c is disposed between respectively two luminescent elements 2a, 2b, 2c or 2d. Parallel to the plane in which the luminescent elements and the upconverters are disposed adjacently, a solar cell 1 is disposed, which touches that side of the respective upconverter which is not in contact with a luminescent element or a mirror 5. This solar cell 1 is again electrically connected by contacts 4a, 4b.

If now radiation 6 impinges on the solar cell 1, the frequency of which is higher than the band gap frequency $v_{BG}$ of the solar cell 1, then this is absorbed by the solar cell. However, radiation 8, the frequency of which is below the band gap frequency $v_{BG}$ of the solar cell 1 is transmitted from the latter and impinges on a luminescent element 2a to 2d. The latter thereupon emits radiation 7 which passes through a first selectively reflecting layer 9a to 9f onto an upconverter 3a to 3c. The latter converts the radiation 7 into radiation 6, the frequency of which is above the band gap frequency of the solar cell and therefore can be converted by the latter into electrical energy. That side of the luminescent elements 2a to 2d which abuts neither against a mirror nor via a first selectively reflecting structure against an upconverter is coated with a second selectively reflecting layer 10a, 10b, 10c or 10d.

The permeability of the first selectively reflecting layer is again shown in enlargement 22. The permeability of the second selectively reflecting layer is shown in enlargement 21. The functions of these selectively reflecting layers 9a and 10a correspond to those in FIG. 1.

The invention claimed is:

1. A solar element having at least one solar cell which has a band gap frequency $v_{BG}$,
    at least one luminescent element which absorbs electromagnetic radiation with frequencies between two frequencies $v_{LE1}$ and $v_{LE2} \geq v_{LE1}$ and emits electromagnetic radiation with at least a frequency $v_{LE3}$,
    at least one upconverter which absorbs electromagnetic radiation with frequencies between two frequencies $v_{HK1}$ and $v_{HK2} \geq v_{HK1}$ and emits radiation with at least a frequency $v_{HK3}$, and also
    a first selectively reflecting structure which reflects a part of the incident electromagnetic radiation and transmits a part of the incident radiation,
    wherein $v_{LE1}$ is smaller than $v_{BG}$,
    there applies for at least one of the at least one frequencies $V_{LE3}$, $V_{HK1} \leq V_{LE3} \leq V_{HK2}$, and
    there applies for at least one of the at least one frequencies $v_{HK3}$, $v_{HK3} \geq v_{BG}$,
    wherein the at least one luminescent element is disposed adjacent to respectively the first selectively reflecting structure and the first selectively reflecting structure is disposed adjacent to respectively at least one of the at least one upconverters and the at least one upconverter is disposed adjacent to the solar cell, and
    wherein the at least one luminescent element has a top surface having a total surface area that faces the solar cell and the at least one upconverter has a top surface having a total surface area that faces the solar cell and wherein the portion of the total surface area of the top surface of the at least one luminescent element that faces the solar cell is greater than the total surface area of the top surface of the at least one upconverter that faces the solar cell.

2. The solar element according to claim 1, wherein the upconverters have at least one area as part of their surface, orientated towards a luminescent element, and the first selective reflecting structure completely covers the surface of the upconverters that is orientated towards the luminescent element.

3. The solar cell element according to claim 1, further comprising at least one mirror which is disposed adjacently or abutting relative to the at least one luminescent element with the mirror plane parallel to the surface thereof.

4. The solar element according to claim 3, wherein the first selectively reflecting structures reflect electromagnetic radiation with frequencies $\geq v_{BG}$ and transmit electromagnetic radiation with frequencies between $v_{HK1}$ and $v_{BG}$.

5. The solar element according to claim 1, wherein at least one luminescent element is disposed directly abutting against a first selectively reflecting structure and/or the first selectively reflecting structure is disposed directly abutting against at least one upconverter and/or at least one upconverter is disposed directly abutting against a solar cell.

6. The solar element according to claim 1, further comprising a second selectively reflecting structure disposed on at least a part of the surface of the at least one luminescent element, which second selectively reflecting structure is adjacent to the solar cell and reflects a part of the radiation impinging thereon and transmits a part of the radiation impinging thereon.

7. The solar element according to claim 6, wherein the at least one luminescent element as part of its surface has an area, orientated towards the solar cell, and the second selectively reflecting structure completely covers the area of the surface of the at one luminescent element wherever no first selectively reflecting structure or upconverter is disposed.

8. The solar element according to claim 6, wherein the second selectively reflecting structure reflects electromagnetic radiation with the at least one frequency $v_{LE3}$ and also transmits electromagnetic radiation with frequencies between $v_{LE1}$ and $v_{BG}$.

9. The solar element according to claim 6, wherein the sum of the surface area of the upconverters which is orientated towards the solar cell and the surface area of the luminescent elements which is orientated towards the solar cell but not towards an upconverter is greater than the sum of the surface regions with which the upconverters are orientated towards the luminescent elements.

10. The solar element according to claim 6, wherein the total surface area of the second selectively reflecting structure is greater than the total surface area of the first selectively reflecting structure.

11. The solar element according to claim 3, wherein mirrors are disposed on each surface of the luminescent elements, on which surface no selectively reflecting structure is disposed.

12. The solar element according to claim 1, wherein at least one of the at least one upconverters is disposed between a luminescent element and a solar cell.

13. The solar element according to claim 1, wherein at least one of the at least one upconverters is disposed between at least two luminescent elements, the upconverter having at least one area with which it abuts against the solar cell.

14. The solar element according to claim 1, wherein the upconverter has or comprises sodium yttrium fluoride or $NaYF_4$: $Er^{3+}$ doped with erbium.

* * * * *

UNITED STATES PATENT AND TRADEMARK OFFICE
CERTIFICATE OF CORRECTION

PATENT NO.       : 8,507,790 B2
APPLICATION NO.  : 12/733851
DATED            : August 13, 2013
INVENTOR(S)      : Goldschmidt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 534 days.

Signed and Sealed this
Fifteenth Day of September, 2015

Michelle K. Lee
*Director of the United States Patent and Trademark Office*